United States Patent
Smith et al.

(10) Patent No.: US 8,415,217 B2
(45) Date of Patent: Apr. 9, 2013

(54) PATTERNING A GATE STACK OF A NON-VOLATILE MEMORY (NVM) WITH FORMATION OF A CAPACITOR

(75) Inventors: Bradley P. Smith, Austin, TX (US); Mehul D. Shroff, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 180 days.

(21) Appl. No.: 13/077,563

(22) Filed: Mar. 31, 2011

(65) Prior Publication Data
US 2012/0252178 A1 Oct. 4, 2012

(51) Int. Cl.
*H01L 21/8242* (2006.01)
*H01L 21/336* (2006.01)
*H01L 21/44* (2006.01)

(52) U.S. Cl.
USPC ............ 438/239; 438/257; 438/585; 438/669

(58) Field of Classification Search .................. None
See application file for complete search history.

(56) References Cited

U.S. PATENT DOCUMENTS

| | | | |
|---|---|---|---|
| 6,424,568 B2 | 7/2002 | Ahn | |
| 6,664,168 B1 | 12/2003 | Andideh et al. | |
| 6,716,694 B2 * | 4/2004 | Yamada | 438/239 |
| 6,898,069 B2 | 5/2005 | Yamaguchi et al. | |
| 7,560,763 B2 * | 7/2009 | Ikegami | 257/315 |
| 2004/0072397 A1 | 4/2004 | Lowe et al. | |
| 2005/0093050 A1 | 5/2005 | Rost et al. | |
| 2006/0024893 A1 | 2/2006 | Min et al. | |
| 2006/0292815 A1 | 12/2006 | Roberts et al. | |

FOREIGN PATENT DOCUMENTS

| | | |
|---|---|---|
| WO | 2006023026 A2 | 3/2006 |
| WO | 2007001783 A2 | 4/2007 |
| WO | 2009120407 A2 | 10/2009 |

OTHER PUBLICATIONS

Richier et al.; "Investigation on Different ESD Protection Strategies Devoted to 3.3 V RF Applications (2Ghz) in a 0.18um CMOS Process"; EOS/ESD Symposium; Sep. 2000; pp. 3A.2.1-3A.2.9; IEEE.
Salman et al.: "SOI Lateral Diode Optimization for ESD Protection in 130nm and 90nm Technologies";EOS/ESD Symposium; Sep. 2005; 7 Pages; IEEE.
Voldman et al.: "Electrostatic Discharge Protection in Silicon-on-Insulator Technology"; IEEE International SOI Conference; Oct. 1999; pp. 68-71; IEEE.

* cited by examiner

*Primary Examiner* — Scott B Geyer
(74) *Attorney, Agent, or Firm* — Joanna G. Chiu; James L. Clingan, Jr.

(57) ABSTRACT

A capacitor and an NVM cell are formed in an integrated fashion so that the etching of the capacitor is useful in end point detection of an etch of the NVM cell. This is achieved using two conductive layers over an NVM region and over a capacitor region. The first conductive layer is patterned in preparation for a subsequent patterning step which includes a step of patterning both the first conductive layer and the second conductive layer in both the NVM region and the capacitor region. The subsequent etch provides for an important alignment of a floating gate to the overlying control gate by having both conductive layers etched using the same mask. During this subsequent etch, the fact that first conductive material is being etched in the capacitor region helps end point detection of the etch of the first conductive layer in the NVM region.

20 Claims, 7 Drawing Sheets

US 8,415,217 B2

PATTERNING A GATE STACK OF A NON-VOLATILE MEMORY (NVM) WITH FORMATION OF A CAPACITOR

CROSS-REFERENCE TO RELATED APPLICATION(S)

This application is related to U.S. patent application Ser. No. 13/077,581, filed on even date, entitled "PATTERNING A GATE STACK OF A NON-VOLATILE MEMORY (NVM) WITH FORMATION OF A GATE EDGE DIODE," naming Bradley P. Smith as inventor, and assigned to the current assignee hereof, and to U.S. patent application Ser. No. 13/077,569, filed on even date, entitled "PATTERNING A GATE STACK OF A NON-VOLATILE MEMORY (NVM) WITH FORMATION OF A METAL-OXIDE-SEMICONDUCTOR FIELD EFFECT TRANSISTOR (MOSFET)," naming Bradley P. Smith, and James W. Miller as inventors, and assigned to the current assignee hereof.

BACKGROUND

1. Field

This disclosure relates generally to non-volatile memories (NVMs), and more specifically, to patterning gate stacks of the NVMs.

2. Related Art

Gate stacks of NVM bit cells often include two layers of conductive material and either one of those conductive layers is also used for forming logic circuits or other circuits. Typically, both layers of conductive material are etched using a same mask to form the gate stack. During the etch of the two conductive materials of the NVM gate stack, end point detection is important in order to prevent over etching. Such an over etch may reduce the reliability and/or increase variability of the NVM array.

FIGS. 1-3 illustrate cross-sectional views of various stages during the formation of an integrated circuit having an NVM region and a tile region, in accordance with the prior art. Referring to FIG. 1, a first polysilicon layer is formed over the substrate in both the NVM region and the tile region. The first polysilicon layer is patterned such that a portion remains between the isolation regions in each of the NVM and tile regions. Subsequently, a dielectric layer is formed over the first polysilicon layer in both the NVM and tile regions, and a second polysilicon layer is formed over the dielectric layer in both the NVM and tile regions. In FIG. 2, a photoresist layer is formed over the second polysilicon layer and patterned, wherein the remaining portions of the photoresist layer correspond to a gate stack in the NVM region and a tile feature (also referred to as a dummy feature or fill feature) in the tile region. Each of the first polysilicon layer, dielectric layer, and the second dielectric layer is simultaneously etched, using the patterned photoresist layer, in the NVM region and the tile region. Therefore, referring to FIG. 3, the simultaneous etching in the NVM region and the tile region result in the formation of a gate stack in the NVM region having a portion of the first polysilicon layer and the second polysilicon layer and a tile feature in the tile region having both a portion of the first polysilicon layer and the second polysilicon layer. The tile feature in the tile region is formed over the substrate, between the isolation regions and not on the isolation regions. The simultaneous etching of the tile feature in the tile region at the same time as the gate stack in the NVM region provides additional material for use in end point detection during the gate stack etch. Note that the resulting tile feature is not electrically active.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a capacitor is formed in a capacitor region of an integrated circuit during formation of an NVM gate stack in an NVM region of the integrated circuit. The capacitor is formed from a stack of layers which includes the same layers of material as the NVM gate stack so as to simulate the NVM gate stack. During an etch of the NVM gate stack, a pair of opposing sides of the capacitor are also etched so that the etches of both the NVM gate stack and the pair of opposing sides of the capacitor occur and end at the same time. This may allow for improved end point detection of the NVM gate stack etch due to increased volume of the material being etched.

Figure 1:
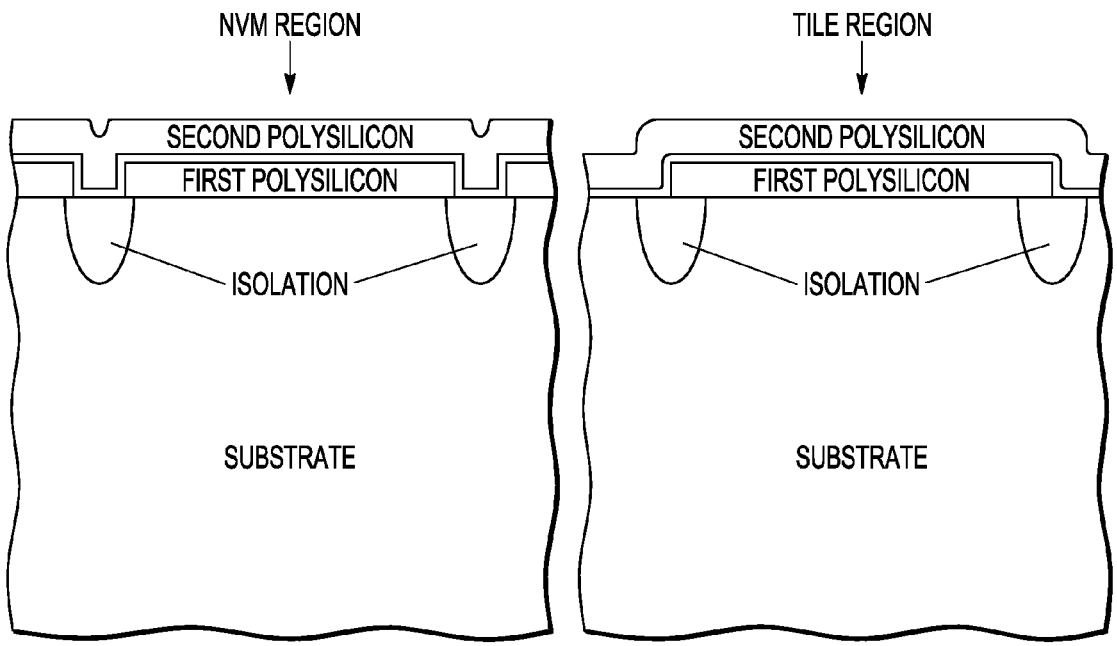
FIG. 1 illustrates a cross-sectional view of an integrated circuit having an NVM region and a tile region at a stage in processing, in accordance with the prior art.
Figure 2:
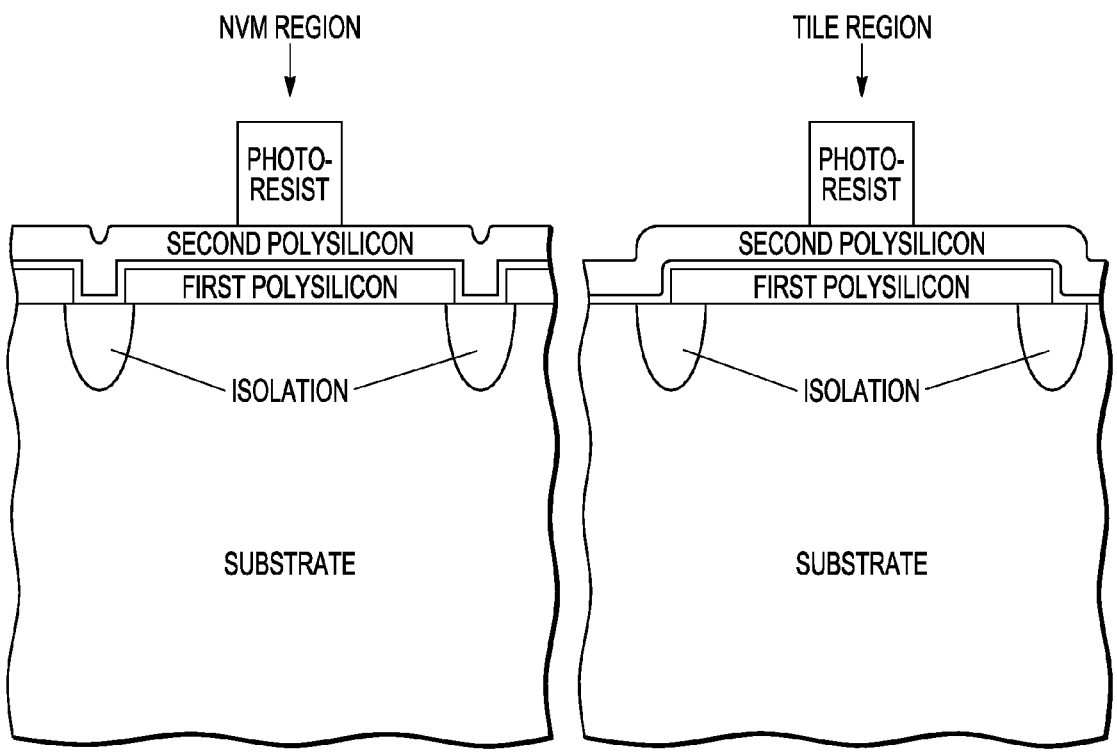
FIG. 2 illustrates a cross-section view of the integrated circuit of FIG. 1 at a subsequent stage in processing, in accordance with the prior art.
Figure 3:
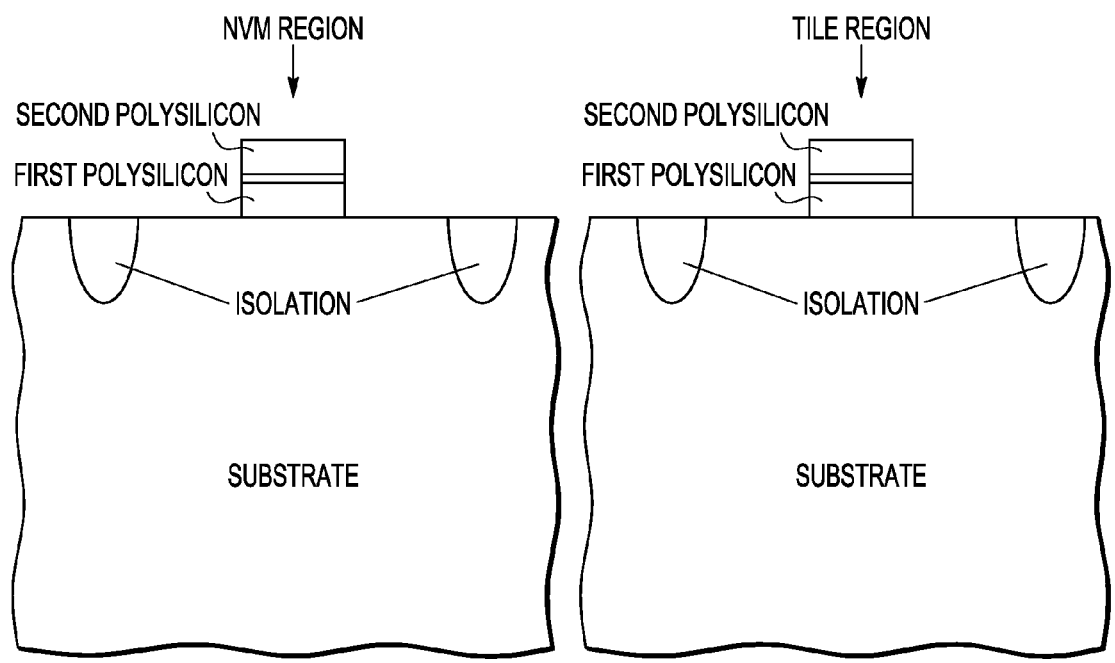
FIG. 3 illustrates a cross-section view of the integrated circuit of FIG. 2 at a subsequent stage in processing, in accordance with the prior art.
Figure 4:
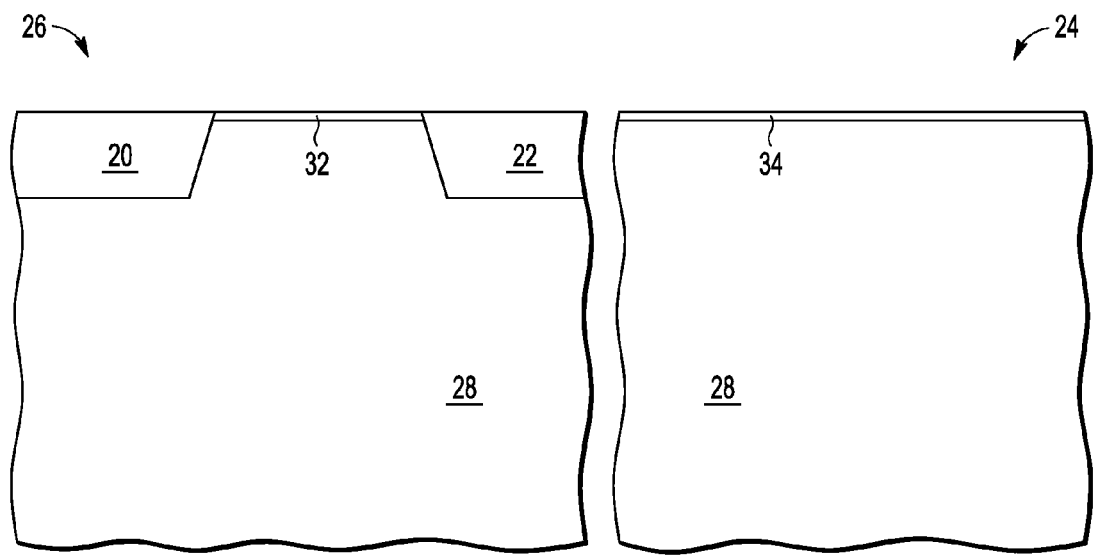
FIG. 4 illustrates a cross-sectional view of an integrated circuit having an NVM region and a capacitor region at a stage in processing, in accordance with an embodiment of the present invention.

Shown in FIG. 4 in a cross-sectional view of an integrated circuit having a capacitor region (the left portion) and an NVM region (the right portion). FIG. 4 illustrates capacitor 26 (in the left portion) and NVM stack 24 (in the right portion)

at an early stage in processing. Included in FIG. 4 is a substrate 28 and a gate dielectric 32 over substrate 28 in the capacitor region and a gate dielectric 34 over substrate 28 in the NVM region. Substrate 28 can be any semiconductor material or combinations of materials, such as gallium arsenide, silicon germanium, silicon-on-insulator (SOI), silicon, monocrystalline silicon, the like, and combinations of the above. In one embodiment, each of gate dielectrics 32 and 34 are formed by growing an oxide layer on substrate 28. Also, in the capacitor region, substrate 28 includes isolation regions 20 and 22 (which may also be referred to as field isolation regions).

Figure 5:
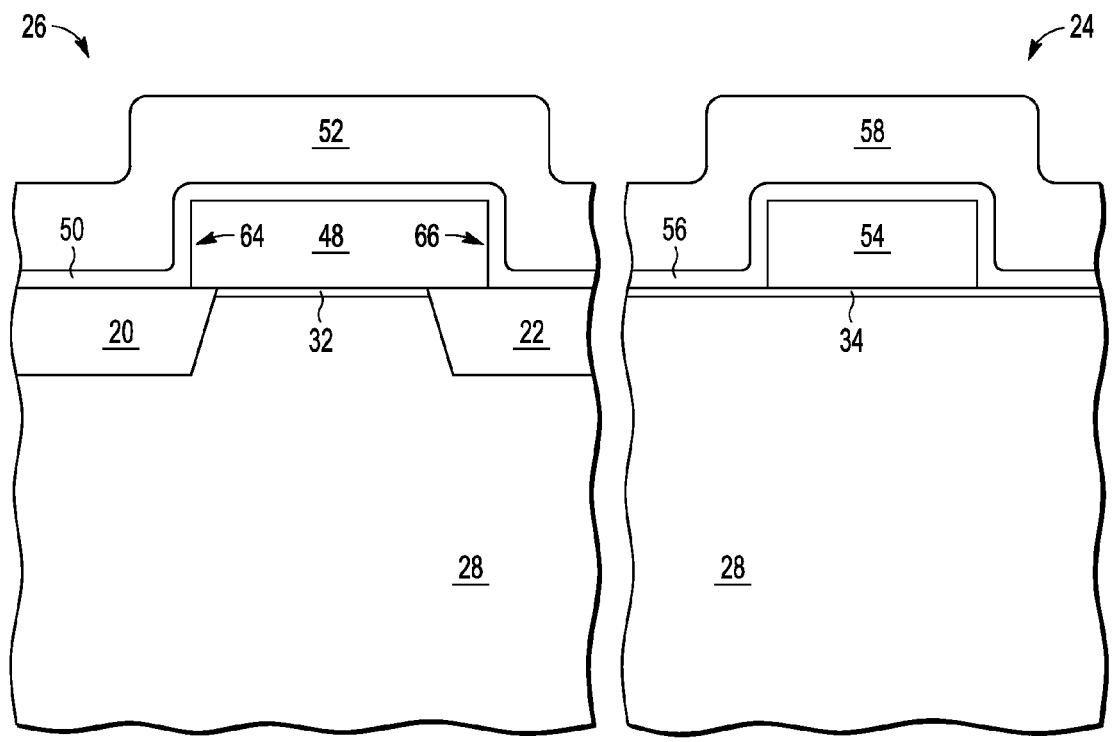
FIG. 5 illustrates a cross-sectional view of the NVM region and the capacitor region of FIG. 4 at a subsequent stage in processing, in accordance with an embodiment of the present invention.

Shown in FIG. 5 are capacitor 26 and NVM gate stack 24 in cross section form after forming a patterned conductive layer 48 over gate dielectric 32 in the capacitor region and a patterned conductive layer 54 over gate dielectric 34 in the NVM region. In one embodiment, a conductive layer, such as polysilicon, is deposited over gate dielectric 32 and gate dielectric 34. This conductive layer is then subsequently patterned in each of the capacitor region and NVM region to form patterned conductive layer 48 and patterned conductive layer 54. In the capacitor region, the patterning forms opposing sides 64 and 66 of conductive layer 48. In one embodiment, exposed portions of oxide layer 32 may be removed during the etch of conductive layer 48. Note also that conductive layer 48 may also be referred to as a bottom capacitor layer or a bottom electrode layer. In the NVM region, patterned conductive layer 54 will be used to form a bottom layer of NVM gate stack 24 and may also be referred to as a patterned floating gate layer. After formation of patterned conductive layer 48 and patterned conductive layer 54, a dielectric layer 50 is formed over patterned conductive layer 48 in the capacitor region and a dielectric layer 56 is formed over patterned conductive layer 54 in the NVM region. Dielectric layers 50 and 56 may also be referred to as insulating layers. In one embodiment, dielectric layers 50 and 56 may be formed from a same layer and may be formed by sequentially depositing oxide, then nitride, and then oxide. This type of layer may be referenced as an ONO layer. Other dielectrics or combinations of dielectrics may also be used for dielectric layers 50 and 56. A conductive layer 52 is formed over dielectric layer 50 in the capacitor region and a conductive layer 58 is formed over dielectric layer 56 in the NVM region. In one embodiment, conductive layers 52 and 58 are formed from a same layer and may be a polysilicon layer. In one embodiment, conductive layers 52 and 58 are formed by deposition. For the case of conductive layers 48, 54, 52, and 58 being polysilicon, layers 48 and 54 may be referred to as first poly and layers 52 and 58 as second poly. Note that each of dielectric layer 50 and conductive layer 52 extend past each of sides 64 and 66 such that they overlap each of sides 64 and 66. In the illustrated embodiment, note that patterned conductive layer 48 is formed such that it extends over onto isolation regions 20 and 22 such that edge 64 is over isolation region 20 and edge 66 is over isolation region 22. However, in alternate embodiments, patterned conductive layer 48 may be formed over active substrate regions.

Figure 6:
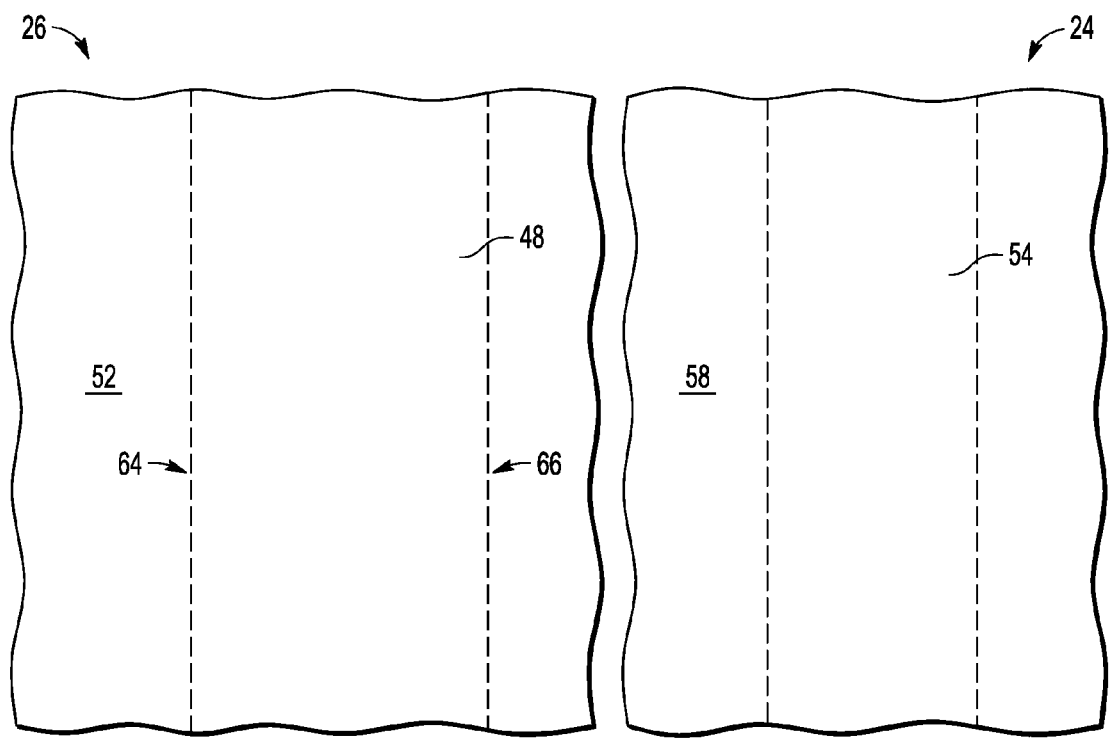
FIG. 6 illustrates a top-down view of the NVM region and the capacitor region of FIG. 5.

Shown in FIG. 6 are top-down views of capacitor 26 and NVM gate stack 24 of FIG. 5. Therefore, note that conductive layer 52 overlaps a strip of conductive layer 48 in the capacitor region and that conductive layer 58 overlaps a strip of conductive layer 54 in the NVM region.

Figure 7:
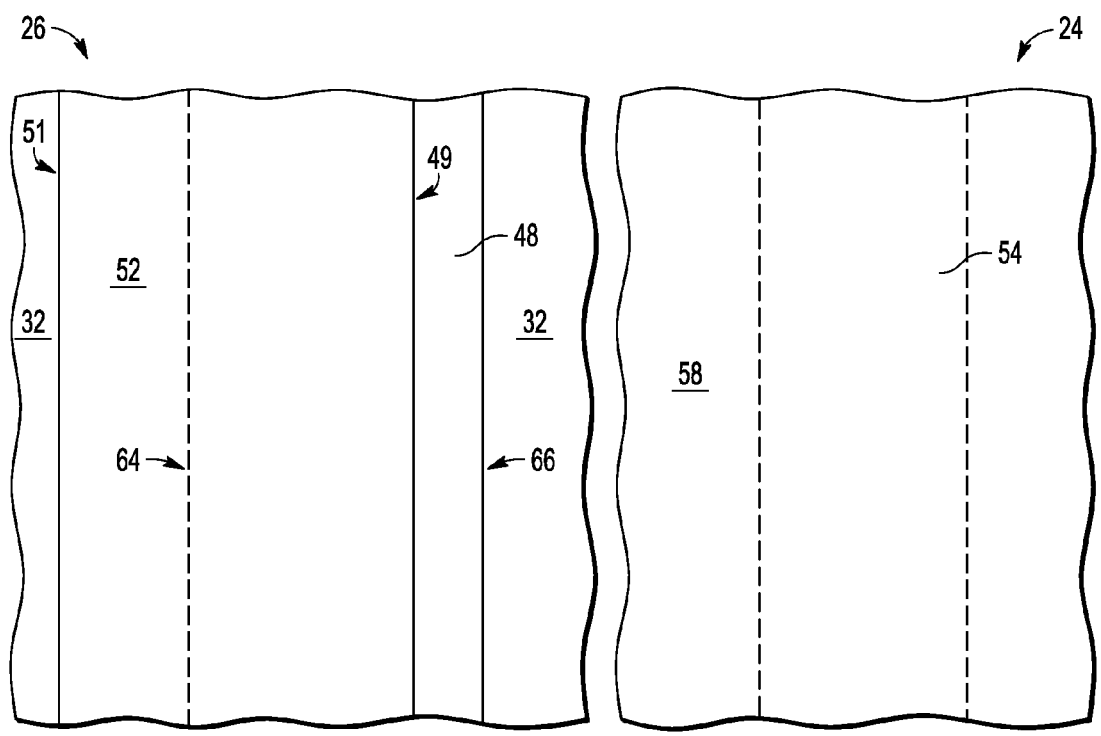
FIG. 7 illustrates a top-down view of the NVM region and the capacitor region of FIG. 6 at a subsequent stage in processing, in accordance with an embodiment of the present invention.

Shown in FIG. 7 are top-down views of capacitor 26 and NVM gate stack 24 of FIG. 6 at a subsequent stage in processing. In FIG. 7, a patterned etch of conductive layer 52 and dielectric layer 50 (which is not visible in the top-down view of FIG. 7) is performed to expose portions of gate dielectric 32. The patterned etch results in a patterned conductive layer 52 (which may also be referred to as a top electrode layer) which overlaps side 64 of conductive layer 48 and has opposing sides 51 and 49. In the illustrated embodiment, sides 64, 66, 51, and 49 are all parallel to each other. Note that a first portion of conductive layer 52 remains directly on gate dielectric 32, extending past side 64 of conductive layer 48, and that a second portion of conductive layer 52 overlaps onto conductive layer 48. That is, side 51 is not over conductive layer 48 and side 49 is over conductive layer 48. Therefore, note that a top surface portion of conductive layer 48 (which is adjacent side 49 and between side 49 and side 66) is exposed as a result of this patterned etch. In one embodiment, note that the exposed portions of gate dielectric 32 may also be removed so as to expose underlying substrate 28. Also, note that this etch does not remove any portion of conductive layer 58 in the NVM region.

Figure 8:
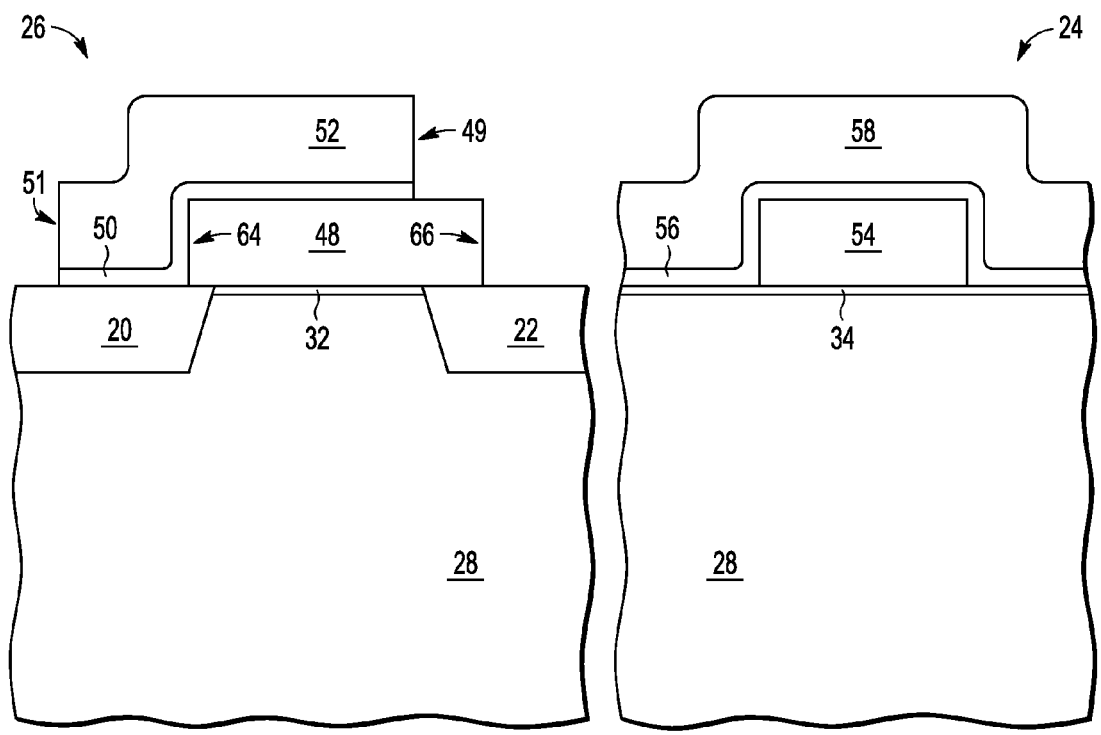
FIG. 8 illustrates a cross-sectional view of the NVM region and the capacitor region of FIG. 7.

Shown in FIG. 8 is a cross-sectional view of capacitor 26 and NVM gate stack 24 of FIG. 7. Note that a top portion of conductive layer 48 and side 66 of conductive layer 48 are exposed, while conductive layer 52 and dielectric layer 50 overlap side 64 of conductive layer 48.

Figure 9:
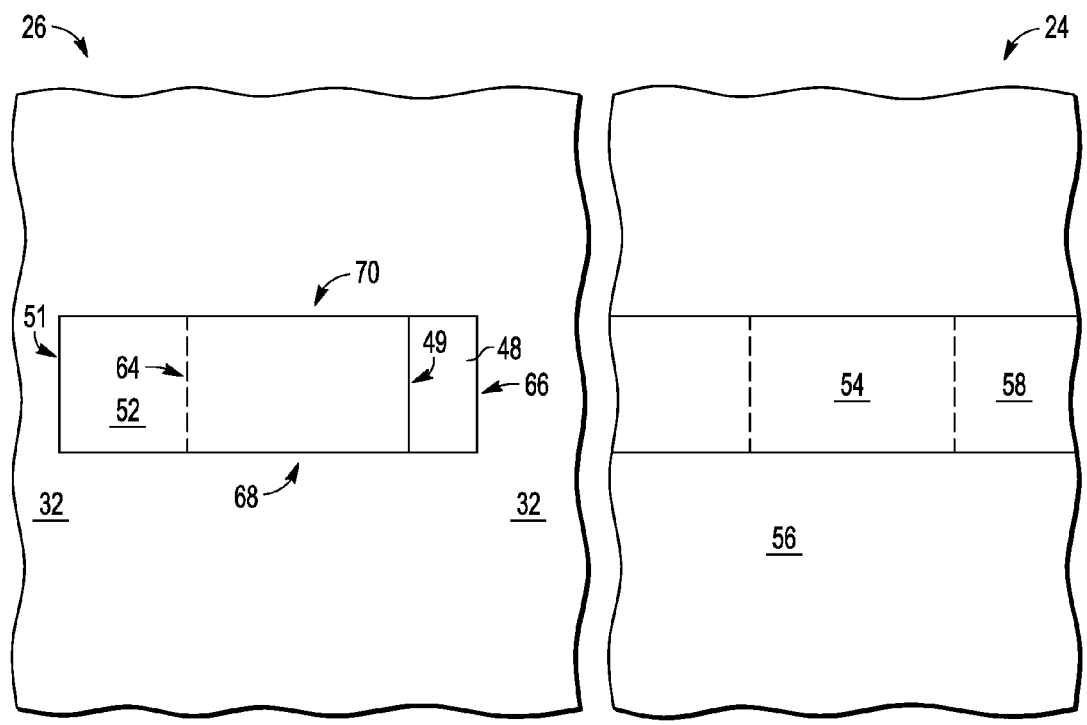
FIG. 9 illustrates a top-down view of the NVM region and the capacitor region of FIG. 8 at a subsequent stage in processing, in accordance with an embodiment of the present invention.

Shown in FIG. 9 is a top-down view of capacitor 26 and NVM gate stack 24 of FIG. 8 at a subsequent stage in processing. A patterned etch is performed through conductive layer 52, dielectric layer 50, and conductive layer 48 in the capacitor region and through conductive layer 58, dielectric layer 56, and conductive layer 54 in the NVM region. Therefore, referring first to the capacitor region, the patterned etch forms opposing sides 68 and 70 of conductive layer 48 and thus of capacitor 26. Note that a portion of conductive layer 52 extends from the top of conductive layer 48 past side 64 of conductive layer 48 and is aligned to sides 70 and 68 of conductive layer 48. Conductive layer 52 forms a top capacitor electrode region of capacitor 26 and conductive layer 48 forms a bottom capacitor layer (i.e. a bottom electrode) of capacitor 26. Therefore, in one embodiment, the patterned etch is performed by forming a mask over the capacitor region having a pattern, where this pattern is of the top capacitor electrode region. Note that sides 70 and 68 of the bottom capacitor layer are aligned and parallel to corresponding sides of the top conductive capacitor electrode region with region 72 (which lies between sides 51 and 49 of conductive layer 52 and between sides 64 and 66 of conductive layer 48).

Referring to the NVM region, the patterned etch forms NVM gate stack 24 which includes conductive layer 54, gate dielectric 56 over conductive layer 54, and conductive layer 58 over gate dielectric 56. Therefore, in one embodiment, the patterned etch is performed by forming a mask over the NVM region having a pattern of a word line of an NVM bit cell which will also define a control gate of the NVM bit cell (i.e. a control gate of NVM gate stack 24). During this patterned etch, conductive layers 58 and 54 are patterned to desirably have nearly vertical sidewalls using an anisotropic etch. This etch is ended by detecting that the etch has reached gate dielectric 34 in the NVM region of NVM gate stack 24. A change in the material composition in the etch chamber is detected when the etch is no longer vertically etching polysilicon and is slowly etching gate dielectric 34, which may be grown oxide (which may also be called thermal oxide). Therefore, the etch in the capacitor region provides additional material for detection that the end point of the NVM gate stack etch has been reached. For example, note that the etch which forms sides 70 and 68 goes through all of conductive layer 52, dielectric layer 50, and conductive layer 48. In this manner, this etch imitates the etch which is performed in the NVM region to form NVM gate stack 24 since the same type of layers are etched. Note that the patterned etch in the NVM region results in a control gate (a remaining portion of conductive layer 58) of an NVM memory cell over a floating gate (a remaining portion of conductive layer 54) of an NVM memory cell. After completing the patterned etches in the capacitor region and NVM region illustrated in FIG. 9, in one embodiment, source/drain regions and sidewall spacers are formed adjacent NVM gate stack 24. In one embodiment, the source/drain regions are formed by performing an implant into substrate 28 using the control gate of NVM gate stack 24 as a mask. In one embodiment, dielectric layer 56 which is adjacent gate stack 24 may is removed after performing the source/drain implant. Also, note that in one embodiment, the control gate of NVM gate stack 24 is a portion of a word line. The sides of conductive layer 54 which are parallel to side 70 and 68 are aligned to opposing sides of conductive layer 58.

Figure 10:
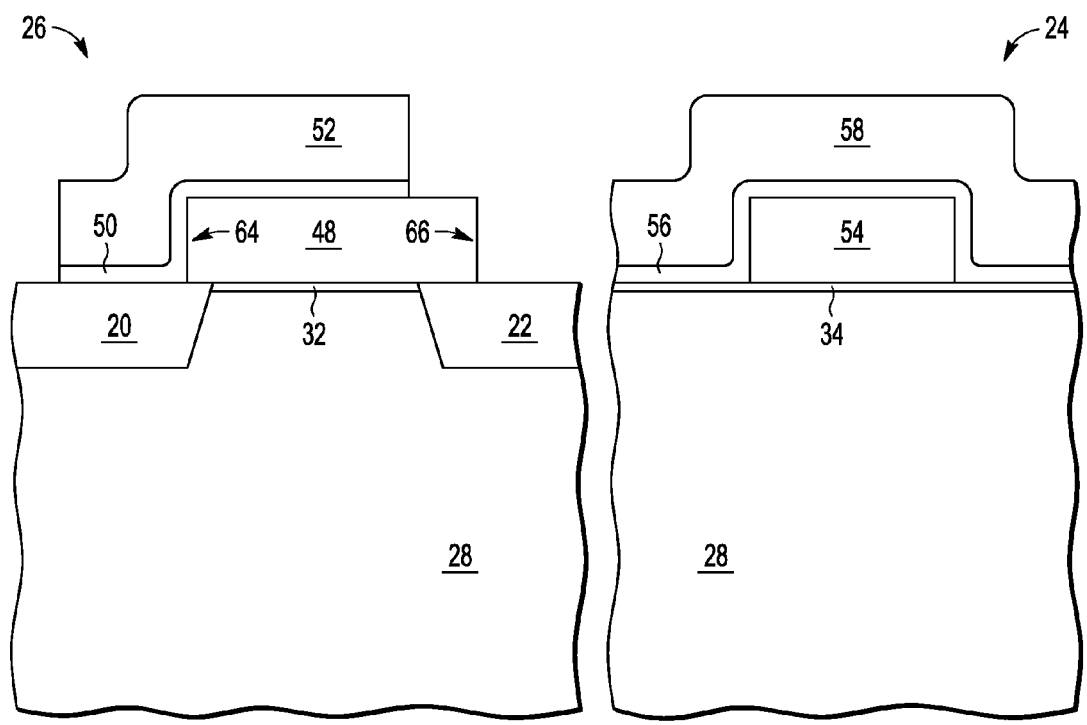
FIG. 10 illustrates a cross-sectional view of the NVM region and the capacitor region of FIG. 9.

Shown in FIG. 10 is a cross-sectional view of capacitor 26 and NVM gate stack 24 of FIG. 9.

Figure 11:
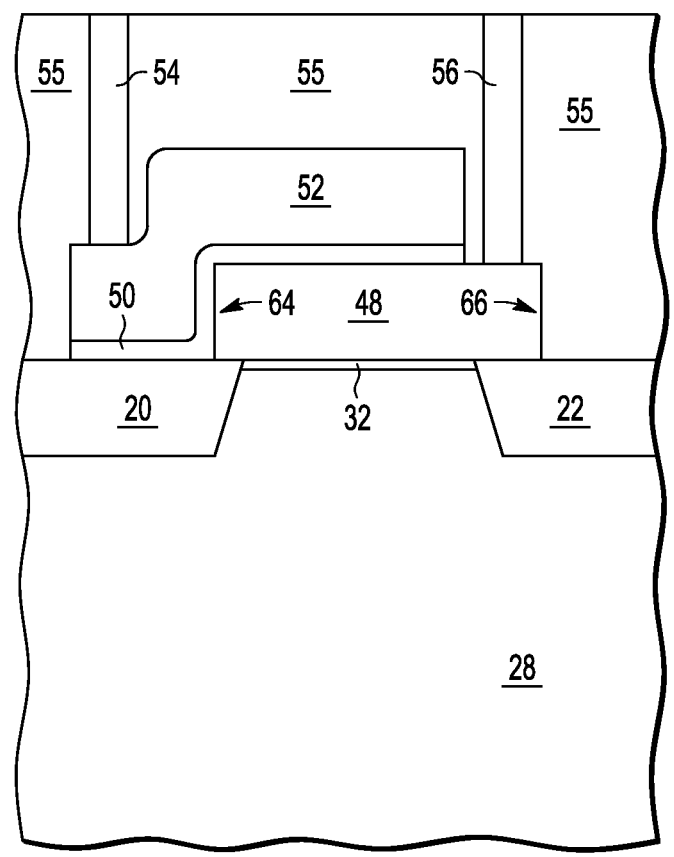
FIG. 11 illustrates a cross-sectional view of the capacitor region of FIG. 10 at a subsequent stage in processing, in accordance with an embodiment of the present invention.

Shown in FIG. 11, is capacitor 26 after forming dielectric layer 55 and contacts 54 and 56. Contact 54 contacts conductive layer 52 (a top conductor of capacitor 26) and contact 56 contacts conductive layer 48 (a bottom conductor of capacitor 26). Note that, in one embodiment, a contact can be made to the active region in substrate 28 adjacent conductive layer 48. That is, this contact would be located either in front or in back of the page of FIG. 10, laterally adjacent conductive layer 48. As seen in the illustrated embodiment, contact 54 may be formed such that it contacts conductive layer 52 over isolation region 20 and contact 56 contacts conductive layer 48 over isolation region 22. In this manner, damage to dielectric 32 during the contact etch to form contacts 54 and 56 may be prevented. However, in alternate embodiments, isolation regions 20 and 22 may not be present under conductive layers 52 and 48.

Figure 12:
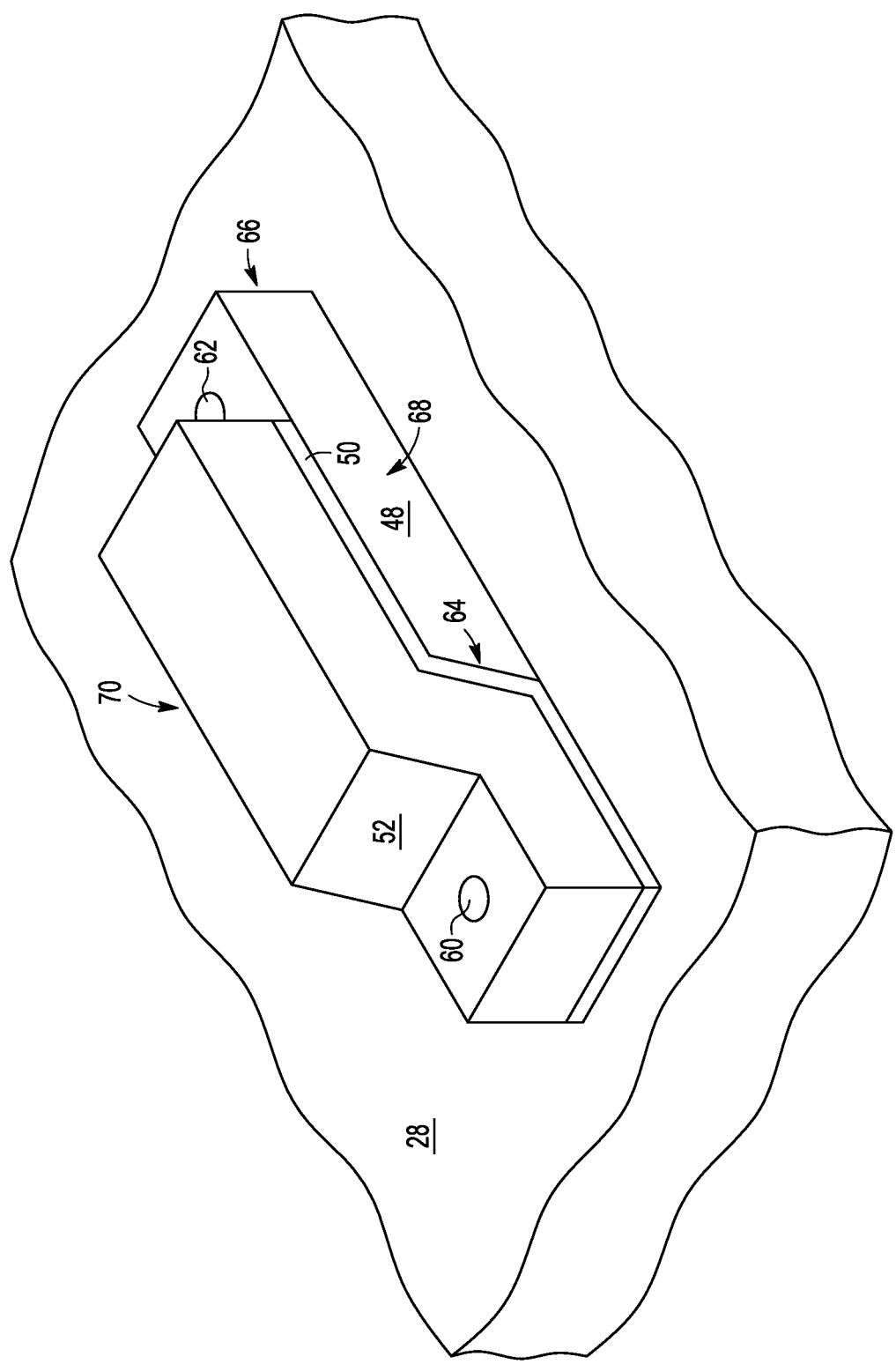
FIG. 12 illustrates a simplified three-dimensional view of the capacitor region of FIG. 11, in accordance with an embodiment of the present invention.

Shown in FIG. 12 is a three-dimensional view of capacitor 26. For ease of illustration, contacts 54 and 56 are not shown (instead, their locations are indicated by contact locations 60 and 62, respectively) and gate dielectric 32 over exposed portions of substrate 28 are not shown. Also illustrated in FIG. 12 are opposing sides 64 and 66 of conductive layer 48 and opposing sides 68 and 70 of conductive layer 48. In one embodiment, sides 64, 68, 70, and 66 may be referred to as a first, second, third, and fourth side of conductive layer 48, respectively, in which sides 68 and 70 are each adjacent side 64. Therefore, note that a portion of capacitor 26 includes dielectric layer 50 and second conductive layer 52 over first conductive layer 48. In this manner, this portion of capacitor 26 simulates the gate stack used for the NVM array in the NVM region. Therefore, opposing sides of capacitor 26 (e.g. sides 68 and 70) whose etch will expose aligned vertical sidewalls of the first and second conductive layers 48 and 52 (which are the same layers present in the stack of materials for NVM gate stack 24) can be simultaneously etched with the etch of NVM gate stack 24 to allow for improved end point detection. Note that other additional steps (such as, for example, isolation formation, gate dielectric formation, various implants, cleans, and anneals) are also not illustrated in FIG. 12 for simplicity.

In one embodiment, prior to formation of conductive layers 48 and 52, a well region may be formed in substrate 28. Furthermore, a doped contact region in the well region may be formed adjacent to conductive layers 48 and 52 to function as a contact to an electrode of a second capacitor present in the capacitor region between the well region and conductive layer 48 and a third capacitor present in the capacitor region between the well region and the conductive layer 52.

Therefore, by now it should be appreciated that there has been provided a method for improved end point detection during the etch of the NVM gate stack etch by simultaneously etching a portion of a capacitor whose stack of materials mimics the stack of materials present in the NVM gate stack.

Although the invention is described herein with reference to specific embodiments, various modifications and changes can be made without departing from the scope of the present invention as set forth in the claims below. For example, different materials may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method of making a capacitor over a capacitor region of a substrate and a non-volatile memory cell in an NVM region of the substrate, including forming a first dielectric layer on the substrate in the capacitor region and the NVM region; forming a first conductive layer on the first dielectric layer; performing a patterned etch of the first conductive layer in the capacitor region to form a bottom capacitor layer having a first side and a second side in the capacitor region; forming a second dielectric layer on the bottom capacitor layer; forming a second conductive layer on the second dielectric layer and extending past the first side and the second side of the bottom capacitor layer; performing a patterned etch of the second conductive layer that leaves a patterned second conductive layer having a first side and a second side, wherein a top portion of the bottom capacitor layer is exposed between the first side of the patterned second conductive layer and the first side of the bottom capacitor layer and the second side of the patterned conductive layer extends past the second side of the bottom capacitor layer; forming a first mask over the capacitor region having a first pattern, wherein the first pattern is of a top capacitor electrode region and a second mask over the NVM region having a second pattern, wherein the second pattern includes a pattern of a control gate of an NVM bit cell; and performing an etch through the patterned second conductive layer, the second dielectric layer, and the bottom capacitor layer to leave the top capacitor electrode region from the patterned second conductive layer that extends past the bottom capacitor layer on the second side of the bottom capacitor layer, wherein third sides of the bottom capacitor layer and the top capacitor electrode region are aligned, fourth sides opposite from the third sides of the bottom capacitor layer and the top capacitor electrode region are aligned, and to leave the control gate from the patterned second conductive layer over a floating gate. Item 2 includes the method of item 1, and further includes forming a first contact to the exposed portion of the first conductive layer. Item 3 includes the method of item 2, and further includes forming a second contact to the second conductive layer, wherein the first contact and the second contacts are contacts of the capacitor. Item 4 includes the method of item 1, wherein the control gate is a portion of a word line. Item 5 includes the method of item 1, wherein the first conductive layer comprises polysilicon and the second conductive layer comprises polysilicon. Item 6 includes the method of item 5, wherein the step of performing the patterned etch of the second conductive layer that leaves the patterned second conductive layer having the first side and the second side is performed such that the second dielectric layer is also patterned and etched with the second conductive layer. Item 7 includes the method of item 1, wherein the step of performing a patterned etch of the second conductive layer that leaves a patterned second conductive layer is performed such that the second dielectric layer is also patterned and etched with the second conductive layer to leave a patterned second dielectric layer. Item 8 includes the method of item 1, and further includes forming a well region in the substrate as the capacitor region, wherein the step of implanting is further characterized as forming a doped contact region in the well region adjacent to first conductive layer and second conductive layer to function as a contact to an electrode of a second capacitor present between the well region and the first conductive layer and a third capacitor present between the well region and the second conductive layer. Item 9 includes the method of item 1, and further includes forming an interlayer dielectric over the gate stack, the second conductive layer in the capacitor region, and the exposed portion of the first conductive layer in the capacitor region. Item 10 includes the method of item 9, and further includes forming a first contact through the interlayer dielectric to the second conductive layer that extends past the bottom capacitor layer. Item 11 includes the method of item 1, and further includes performing an implant using the control gate as a mask to provide source/drain regions in the NVM region.

Item 12 includes a method of making a capacitor over a capacitor region of a substrate and a non-volatile memory cell in an NVM region of semiconductor substrate, including growing an oxide layer on the substrate in the capacitor region and the NVM region; forming a polysilicon layer on the oxide layer; performing a patterned etch of the polysilicon layer in the capacitor region and the NVM region to form a patterned polysilicon layer having a bottom electrode layer having a first side and a second side parallel to the first side in the capacitor region and a floating gate layer in the NVM region; forming an insulating layer on the patterned polysilicon layer; forming a conductive layer on the insulating layer and extending over the capacitor region and the NVM region; performing a patterned etch of the conductive layer to leave a top electrode layer from the conductive layer over the capacitor region, wherein the top electrode layer has a first side over the bottom electrode layer and a second side spaced away from the bottom electrode layer, and wherein the first and second sides of the top electrode layer are parallel to the first and second sides of the bottom electrode layer; forming a first mask over the capacitor region having a first pattern, wherein the first pattern is of a top capacitor electrode and a second mask over the NVM region having a second pattern, wherein the second pattern is of a control gate of an NVM bit cell; performing an etch through the top electrode layer, the insulating layer, the bottom capacitor layer, the conductive layer over the NVM region, and the floating gate layer to leave the first pattern of the top electrode layer and a bottom electrode from the bottom capacitor layer and the control gate from the conductive layer over the NVM region and a floating gate from the floating gate layer, wherein the top electrode has formed a third side and a fourth side parallel to the third side between the first and second sides of the top electrode layer, the bottom electrode has formed a third side and a fourth side parallel to the third side between the first and second sides of the bottom electrode layer, the third side of the top electrode is aligned with the third side of the bottom electrode, the fourth side of the top electrode is aligned with the fourth side of the bottom electrode, the floating gate has a third side and a fourth side parallel to the third side between the first and second sides of the floating gate layer, and the control gate has a first side aligned with the third side of the floating gate and a second side aligned with the fourth side of the floating gate; and performing an implant using the control gate as a mask to provide source/drain regions adjacent to the control gate in the NVM region. Item 13 includes the method of item 12, and further includes forming a first contact on the bottom electrode. Item 14 includes the method of item 13, and further includes forming a second contact on the top electrode. Item 15 includes the method of item 12, wherein the control gate comprises polysilicon. Item 16 includes the method of item 12, wherein the control gate further comprises silicide. Item 17 includes the method of item 12, and further includes forming a well region in the substrate as the capacitor region, wherein the step of implanting is further characterized as forming a doped contact region in the well region around the top electrode and bottom electrode. Item 18 include the method of item 12, and further includes forming an interlayer dielectric over the gate, the conductive layer in the capacitor region, and the exposed portion of the polysilicon layer in the capacitor region. Item 19 includes the method of item 18, and further includes forming a first contact through the interlayer dielectric to the to a portion of the top electrode that extends past the bottom electrode.

Item 20 includes a method of making a capacitor over a capacitor region of a substrate and a non-volatile memory cell in an NVM region of semiconductor substrate, including forming a well region in the capacitor region of the substrate; growing an oxide layer on the substrate in the well region and the NVM region as a gate dielectric; forming a first polysilicon layer on the oxide layer; performing a patterned etch of the polysilicon layer in the well region and the NVM region to form a bottom electrode layer in the well region and a floating gate layer in the NVM region; forming an insulating layer on the polysilicon layer; forming a conductive layer on the insulating layer and over the well region and the NVM region; performing a patterned etch of the conductive layer over the well region to form a patterned conductive layer, wherein the patterned conductive layer has a first side on the bottom electrode layer to expose a first portion of the bottom electrode layer and a second side parallel to the first side spaced away from the bottom electrode layer; and performing a patterned etch through the conductive layer, the insulating layer, the bottom capacitor layer, and the floating gate layer to leave a bottom electrode from the bottom electrode layer, a top electrode from the top electrode layer, a control gate from the conductive layer over the NVM region, and a floating gate from the floating gate layer, wherein the bottom electrode has a covered portion covered by the top electrode and an uncovered portion not covered by the top electrode, the top electrode has a extended portion spaced from the bottom electrode, and the control gate extends past the floating gate in a first direction and has a first side aligned to a first side of the floating gate and a second side aligned to a second side of the floating gate.

What is claimed is:

1. A method of making a capacitor over a capacitor region of a substrate and a non-volatile memory cell in an NVM region of the substrate, comprising:
    forming a first dielectric layer on the substrate in the capacitor region and the NVM region;
    forming a first conductive layer on the first dielectric layer;
    performing a patterned etch of the first conductive layer in the capacitor region to form a bottom capacitor layer having a first side and a second side in the capacitor region;
    forming a second dielectric layer on the bottom capacitor layer;
    forming a second conductive layer on the second dielectric layer and extending past the first side and the second side of the bottom capacitor layer;
    performing a patterned etch of the second conductive layer that leaves a patterned second conductive layer having a first side and a second side, wherein a top portion of the bottom capacitor layer is exposed between the first side of the patterned second conductive layer and the first side of the bottom capacitor layer and the second side of the patterned conductive layer extends past the second side of the bottom capacitor layer;
    forming a first mask over the capacitor region having a first pattern, wherein the first pattern is of a top capacitor electrode region and a second mask over the NVM region having a second pattern, wherein the second pattern includes a pattern of a control gate of an NVM bit cell; and
    performing an etch through the patterned second conductive layer, the second dielectric layer, and the bottom capacitor layer to leave the top capacitor electrode region from the patterned second conductive layer that extends past the bottom capacitor layer on the second side of the bottom capacitor layer, wherein third sides of the bottom capacitor layer and the top capacitor electrode region are aligned, fourth sides opposite from the third sides of the bottom capacitor layer and the top capacitor electrode region are aligned, and to leave the control gate from the patterned second conductive layer over a floating gate.

2. The method of claim 1, further comprising forming a first contact to the exposed portion of the first conductive layer.

3. The method of claim 2, further comprising forming a second contact to the second conductive layer, wherein the first contact and the second contacts are contacts of the capacitor.

4. The method of claim 1, wherein the control gate is a portion of a word line.

5. The method of claim 1, wherein the first conductive layer comprises polysilicon and the second conductive layer comprises polysilicon.

6. The method of claim 5, wherein the step of performing the patterned etch of the second conductive layer that leaves the patterned second conductive layer having the first side and the second side is performed such that the second dielectric layer is also patterned and etched with the second conductive layer.

7. The method of claim 1, wherein the step of performing a patterned etch of the second conductive layer that leaves a patterned second conductive layer is performed such that the second dielectric layer is also patterned and etched with the second conductive layer to leave a patterned second dielectric layer.

8. The method of claim 1, further comprising forming a well region in the substrate as the capacitor region, wherein the step of implanting is further characterized as forming a doped contact region in the well region adjacent to first conductive layer and second conductive layer to function as a contact to an electrode of a second capacitor present between the well region and the first conductive layer and a third capacitor present between the well region and the second conductive layer.

9. The method of claim 1, further comprising forming an interlayer dielectric over the gate stack, the second conductive layer in the capacitor region, and the exposed portion of the first conductive layer in the capacitor region.

10. The method of claim 9, further comprising forming a first contact through the interlayer dielectric to the second conductive layer that extends past the bottom capacitor layer.

11. The method of claim 1, further comprising:
    performing an implant using the control gate as a mask to provide source/drain regions in the NVM region.

12. A method of making a capacitor over a capacitor region of a substrate and a non-volatile memory cell in an NVM region of semiconductor substrate, comprising:
    growing an oxide layer on the substrate in the capacitor region and the NVM region;
    forming a polysilicon layer on the oxide layer;
    performing a patterned etch of the polysilicon layer in the capacitor region and the NVM region to form a patterned polysilicon layer having a bottom electrode layer having a first side and a second side parallel to the first side in the capacitor region and a floating gate layer in the NVM region;
    forming an insulating layer on the patterned polysilicon layer;
    forming a conductive layer on the insulating layer and extending over the capacitor region and the NVM region;
    performing a patterned etch of the conductive layer to leave a top electrode layer from the conductive layer over the capacitor region, wherein the top electrode layer has a first side over the bottom electrode layer and a second side spaced away from the bottom electrode layer, and wherein the first and second sides of the top electrode layer are parallel to the first and second sides of the bottom electrode layer;
    forming a first mask over the capacitor region having a first pattern, wherein the first pattern is of a top capacitor electrode and a second mask over the NVM region having a second pattern, wherein the second pattern is of a control gate of an NVM bit cell;
    performing an etch through the top electrode layer, the insulating layer, the bottom capacitor layer, the conductive layer over the NVM region, and the floating gate layer to leave the first pattern of the top electrode layer and a bottom electrode from the bottom capacitor layer and the control gate from the conductive layer over the NVM region and a floating gate from the floating gate layer, wherein the top electrode has formed a third side and a fourth side parallel to the third side between the first and second sides of the top electrode layer, the bottom electrode has formed a third side and a fourth side parallel to the third side between the first and second sides of the bottom electrode layer, the third side of the top electrode is aligned with the third side of the bottom electrode, the fourth side of the top electrode is aligned with the fourth side of the bottom electrode, the floating gate has a third side and a fourth side parallel to the third side between the first and second sides of the floating gate layer, and the control gate has a first side aligned with the third side of the floating gate and a second side aligned with the fourth side of the floating gate; and performing an implant using the control gate as a mask to provide source/drain regions adjacent to the control gate in the NVM region.

13. The method of claim 12, further comprising forming a first contact on the bottom electrode.

14. The method of claim 13, further comprising forming a second contact on the top electrode.

15. The method of claim 12, wherein the control gate comprises polysilicon.

16. The method of claim 12, wherein the control gate further comprises silicide.

17. The method of claim 12, further comprising forming a well region in the substrate as the capacitor region, wherein the step of implanting is further characterized as forming a doped contact region in the well region around the top electrode and bottom electrode.

18. The method of claim 12, further comprising forming an interlayer dielectric over the gate, the conductive layer in the capacitor region, and the exposed portion of the polysilicon layer in the capacitor region.

19. The method of claim 18, further comprising forming a first contact through the interlayer dielectric to the to a portion of the top electrode that extends past the bottom electrode.

20. A method of making a capacitor over a capacitor region of a substrate and a non-volatile memory cell in an NVM region of semiconductor substrate, comprising:

forming a well region in the capacitor region of the substrate;

growing an oxide layer on the substrate in the well region and the NVM region as a gate dielectric;

forming a first polysilicon layer on the oxide layer;

performing a patterned etch of the polysilicon layer in the well region and the NVM region to form a bottom electrode layer in the well region and a floating gate layer in the NVM region;

forming an insulating layer on the polysilicon layer;

forming a conductive layer on the insulating layer and over the well region and the NVM region;

performing a patterned etch of the conductive layer over the well region to form a patterned conductive layer, wherein the patterned conductive layer has a first side on the bottom electrode layer to expose a first portion of the bottom electrode layer and a second side parallel to the first side spaced away from the bottom electrode layer; and performing a patterned etch through the conductive layer, the insulating layer, the bottom capacitor layer, and the floating gate layer to leave a bottom electrode from the bottom electrode layer, a top electrode from the top electrode layer, a control gate from the conductive layer over the NVM region, and a floating gate from the floating gate layer, wherein the bottom electrode has a covered portion covered by the top electrode and an uncovered portion not covered by the top electrode, the top electrode has a extended portion spaced from the bottom electrode, and the control gate extends past the floating gate in a first direction and has a first side aligned to a first side of the floating gate and a second side aligned to a second side of the floating gate.

* * * * *